(12) United States Patent
Lee et al.

(10) Patent No.: US 6,344,650 B1
(45) Date of Patent: Feb. 5, 2002

(54) ELECTRON GAS GRID SEMICONDUCTOR RADIATION DETECTORS

(75) Inventors: Edwin Y. Lee; Ralph B. James, both of Livermore, CA (US)

(73) Assignee: Sandia Corporation, Livermore, CA (US)

( * ) Notice: Subject to any disclaimer, the term of this patent is extended or adjusted under 35 U.S.C. 154(b) by 0 days.

(21) Appl. No.: 09/298,111

(22) Filed: Apr. 23, 1999

(51) Int. Cl.$^7$ ................................................ G01T 1/24
(52) U.S. Cl. ........................... 250/370.01; 250/370.12; 250/370.13; 257/21
(58) Field of Search ....................... 250/370.12, 370.13, 250/370.01; 257/14, 15, 16, 17, 18, 19, 20, 21, 22

(56) References Cited

U.S. PATENT DOCUMENTS

| | | | | |
|---|---|---|---|---|
| 4,471,370 A | * | 9/1984 | Chen et al. | 257/184 |
| 4,686,550 A | * | 8/1987 | Capasso et al. | 257/12 |
| 5,391,882 A | * | 2/1995 | Rhiger | 250/370.13 |
| 5,627,377 A | * | 5/1997 | Hamilton, Jr. et al. | 250/370.13 |
| 5,757,025 A | * | 5/1998 | Ahn | 257/21 |
| 6,175,120 B1 | * | 1/2001 | McGregor et al. | 250/370.13 |

* cited by examiner

*Primary Examiner*—Seungsook Ham
*Assistant Examiner*—Shun Lee
(74) *Attorney, Agent, or Firm*—L. E. Carnahan

(57) ABSTRACT

An electron gas grid semiconductor radiation detector (EGGSRAD) useful for gamma-ray and x-ray spectrometers and imaging systems is described. The radiation detector employs doping of the semiconductor and variation of the semiconductor detector material to form a two-dimensional electron gas, and to allow transistor action within the detector. This radiation detector provides superior energy resolution and radiation detection sensitivity over the conventional semiconductor radiation detector and the "electron-only" semiconductor radiation detectors which utilize a grid electrode near the anode. In a first embodiment, the EGGSRAD incorporates delta-doped layers adjacent the anode which produce an internal free electron grid well to which an external grid electrode can be attached. In a second embodiment, a quantum well is formed between two of the delta-doped layers, and the quantum well forms the internal free electron gas grid to which an external grid electrode can be attached. Two other embodiments which are similar to the first and second embodiment involve a graded bandgap formed by changing the composition of the semiconductor material near the first and last of the delta-doped layers to increase or decrease the conduction band energy adjacent to the delta-doped layers.

10 Claims, 3 Drawing Sheets

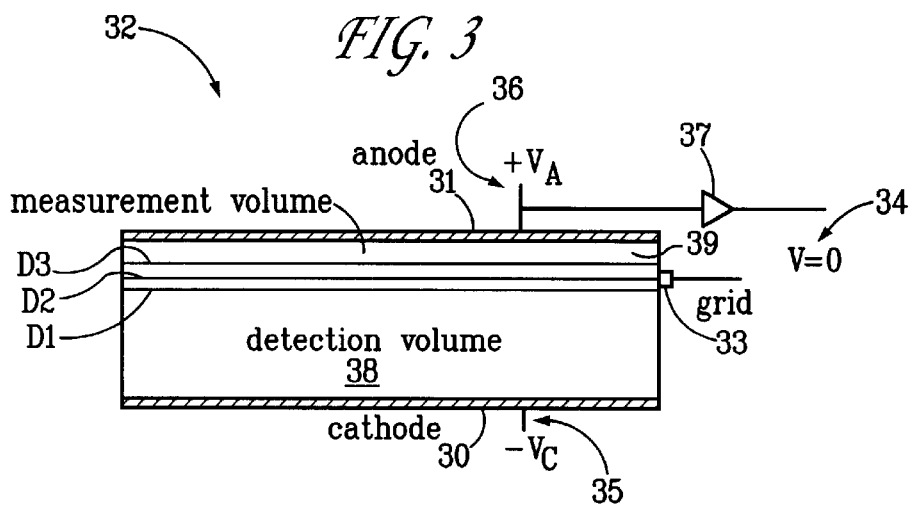
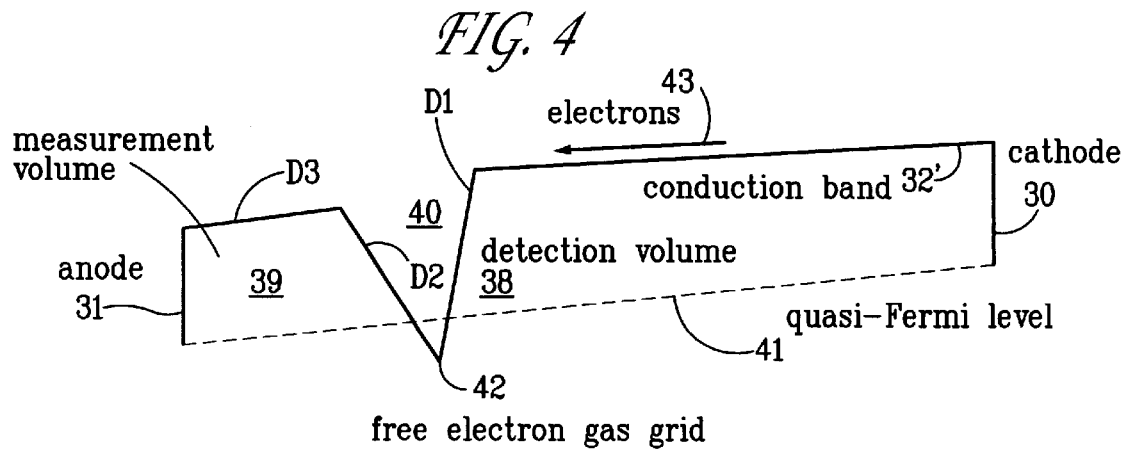
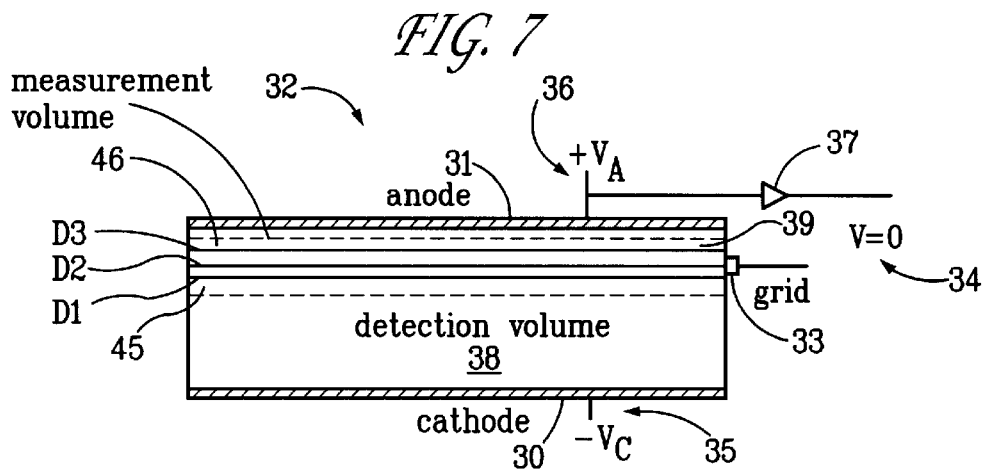

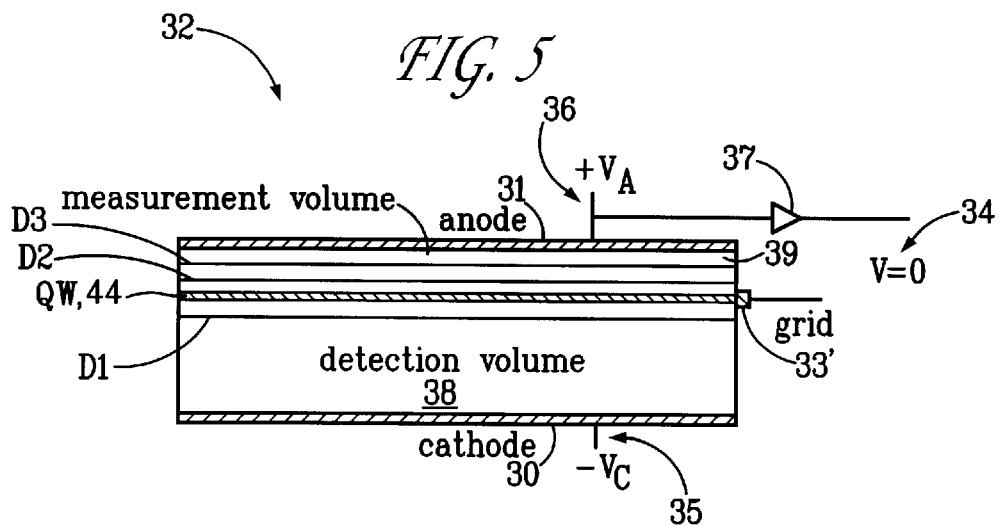
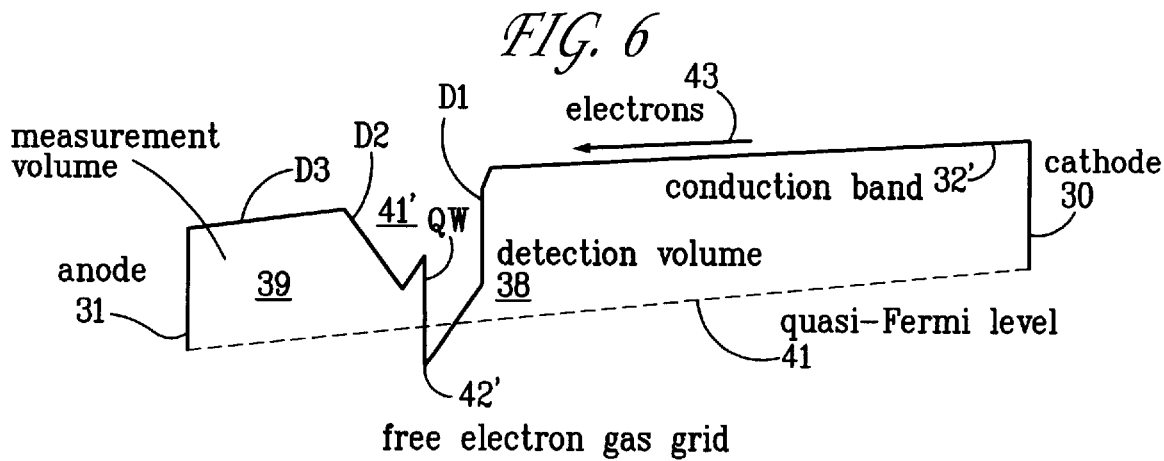
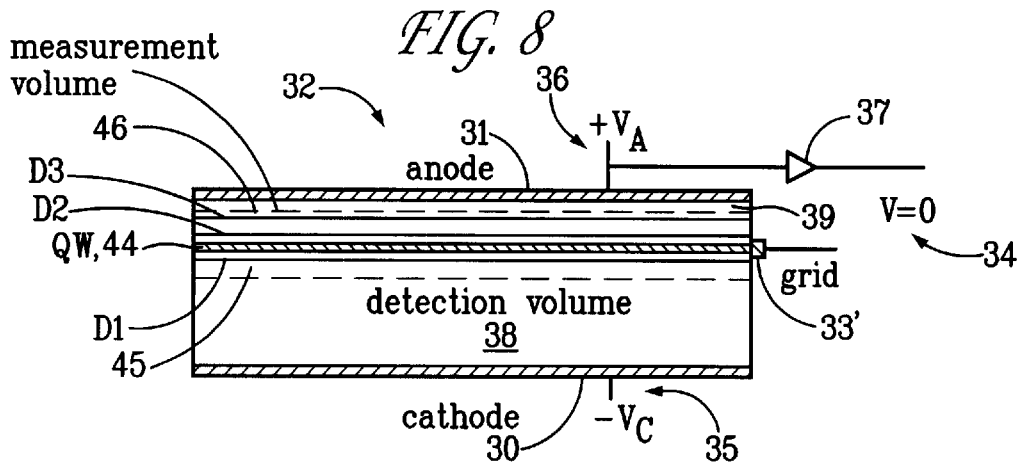

ELECTRON GAS GRID SEMICONDUCTOR RADIATION DETECTORS

The United States Government has rights in this invention pursuant to Contract No. DE-AC04-94AL85000 between the United States Department of Energy and the Sandia Corporation for the operation of the Sandia National Laboratories.

BACKGROUND OF THE INVENTION

The present invention relates to radiation detectors, particularly to planar semiconductor radiation detectors, and more particularly to electron gas grid semiconductor radiation detectors which utilize at least delta-doped layers adjacent to the anode of the detector to form an internal free electron gas grid.

Various types of radiation detectors have been developed for detecting gamma-rays and x-rays, among which are the planar semiconductor radiation detectors. Semiconductor radiation detectors generally operate by absorbing a quantum of gamma-ray or x-ray radiation and by converting the radiation energy into a number of electron-hole pairs that is proportional to the absorbed energy. After the conversion, the motion of the electrons and holes induce electrical signals on the detector electrodes. The electrical signals are also proportional to the energy of the absorbed radiation. Hence, by using a semiconductor radiation detector, one can detect gamma-ray and x-ray radiation and measure its energy spectrum.

The conventional planar semiconductor radiation detector, such as illustrated in FIG. 1, does not function well due to the poor electrical transport properties of the holes. Many of the common radiation detectors are made from CdZnTe or GaAs, with a cathode and anode made for example of gold, and, for these semiconductors, the electrical signal due to the holes is much typically smaller than the electrical signal due to the electrons. These effects are due to the slower motion of the holes and greater probability of trapping of the holes within these materials. Because the total electrical signal is a sum of the signal due to the electrons and the holes, the signal due to the holes complicates the signal analysis and results in poor energy resolution and efficiency in these detectors.

The planar semiconductor radiation detector also suffers from a position dependence on the signal. For example, a signal due to electrons originating from radiation absorbed near the cathode will be larger than a signal originating from near the anode. Thus, the conventional planar semiconductor radiation detectors suffer from both poor electrical transport properties of the holes and from a position dependence of the signal.

Recent efforts have been directed to improve the energy resolution of the planar semiconductor radiation detectors and also to lessen the dependence of the signal on the position of the radiation absorption, and thus allow one to isolate the electrical signal from the electrons. These improved approaches are referred to as "electron-only devices" and have shown to give superior energy resolution for x-ray and gamma-ray radiation over the conventional planar semiconductor radiation detectors. The "electron-only devices" are exemplified by P. N. Luke, "Single-polarity charge sensing in ionization detectors using coplanar electrodes," Appl. Phys. Lett. 65 (22), Nov. 28, 1994; E. Y. Lee, et al., "Device Simulation of an Unipolar Gamma-Ray Detector," Mat. Res. Soc. Symp. Proc., 487, p. 537 (1998), U.S. Pat. No. 5,677,539, issued Oct. 14, 1997 to B. Apotovsky, et al., U.S. application Ser. No. 09/075,419 filed May 8, 1998, entitled, "Method and Apparatus for Electron-Only Radiation Detectors from Semiconductor Materials" by Lund, et al., and U.S. application Ser. No. 09/075,351 filed May 8, 1998, entitled, "High Resolution Ionization Detector and Array of Such Detectors" by McGregor, et al. These "electron-only devices" place a third metallic electrode, called a grid, on the surface of the detector near the anode to electrostatically shield the anode from the signal originating between the grid and the cathode. FIG. 2 illustrates an embodiment of the prior "electron-only devices," which is a unipolar gamma-ray detector of above-referenced Lee, et al. In these devices, all the signals from the anode originate from a motion of the electrons and holes moving between the anode and the grid. Since the electrons move toward the anode while the holes move away from the anode toward the cathode, due to their polarities, the signal on the anode will be dominated by the motion of the electrons. Furthermore, the signal will have much less position dependence, since electron trapping between the grid and anode is unlikely.

In an "electron-only device" one can characterize the space between the grid and the cathode as a detection volume and the region between the grid and the anode as the measurement volume, as shown in FIG. 2. Ideally, all radiation absorbed in the detection volume would give rise to electrical signals due only to the motion of the electrons in the measurement volume. However, there are several imperfections associated with the prior art of the "electron-only" detector, which are:

1. For the grid to shield the anode, the grid can not be placed too close to the anode. This decreases the detection volume of the detector and therefore the radiation detection efficiency of the detector.

2. Many of the electrons created between the grid and the cathode are collected by the grid and produce no signal on the anode. Hence, these detectors have dead regions where no signals can be detected, leading to a loss of detector efficiency.

3. The internal electric field of the detector is highly non-uniform, due to the placement of the external grid. The electric field is uniform only very close to the cathode and the anode. The non-uniformity of the electric field causes variation in the charge collection time of the electrons. Since electron trapping does occur in the detector, this non-uniformity of the electric field results in variation of the signal strength with the position of the x-ray and gamma-ray absorption event, and hence in loss of the energy resolution. Attempts at correcting for the electron trapping by trying to deduce the position of the original radiation absorption are difficult due to the nonuniform internal field. This is commonly attempted by monitoring of the cathode signal and using it to correct the anode signal with electronic circuits external to the detector.

The present invention provides a detector which removes the three above-described imperfections in the "electron-only" detectors, resulting in superior energy resolution and radiation detection efficiency. In addition, the detector of the present invention has all the virtues of the "electron-only" detector, exploiting the excellent transport properties of electrons over holes and having signals that are independent of the position of the interaction. The present invention is an electron gas grid semiconductor radiation detector which employs doping of the semiconductor and variation of the semiconductor detector material to form a two-dimensional electron gas and to allow transistor action within the radiation detector. Superior energy resolution and radiation detection sensitivity over the prior art "electron-only devices" are provided by the present invention. The detector of the present invention utilizes delta-doped layers adjacent to the anode which form an internal free electron gas grid, with or without a quantum well located between two adjacent doped layers, whereby an external electrode can be attached to either a doped layer or the quantum well.

SUMMARY OF THE INVENTION

It is an object of the present invention to provide an improved planar semiconductor radiation detector.

A further object of the invention is to provide an electron gas grid semiconductor radiation detector.

A further object of the invention is to provide an improved planar semiconductor radiation detector which employs doping of the semiconductor material adjacent the anode of the detector and employs variation of the semiconductor material to form a two-dimensional electron gas and to allow transistor action within the radiation detector.

Another object of the invention is to provide an improved semiconductor radiation detector which overcomes the problems associated with the prior art "electron-only" radiation detectors but which exploits the transport properties of electrons over holes and the position dependent signal of the prior art "electron-only" radiation detectors.

Another object of the invention is to provide an electron gas grid semiconductor radiation detector (EGGSRAD) which produces superior energy resolution and radiation detection sensitivity over all previously known semiconductor radiation detectors.

Another object of the invention is to provide an EGGSRAD which has in its structure delta-doped layers which function as atomically thin charged sheets, which are deposited during the growth of the semiconductor, and which produce an internal free electron gas grid to which can be attached an external grid.

Another object of the invention is to provide an EGGSRAD which in addition to the delta-doped layers includes a quantum well layer located between adjacent doped layers and of a material different from the semiconductor material, which produces an internal electron gas grid and results in better anode shielding capacity.

Another object of the invention is to provide an EGGSRAD which includes a graded bandgap by varying the composition of the semiconductor near the delta-doped layers and can be utilized with or without a quantum well layer.

Other objects and advantages of the present invention will become apparent from the following description and accompanying drawings. The improved planar semiconductor radiation detector of the present invention broadly constitutes an electron gas grid semiconductor radiation detector (EGGSRAD) which includes four (4) structural embodiments which are described hereinafter as: 1) an elementary electron gas grid semiconductor radiation detector (EEGGSRAD), 2) a modulation doped EGGSRAD (MODEGGSRAD), 3) a graded bandgap EGGSRAD (GRABEGGSRAD), and 4) a graded bandgap MODEGGSRAD (GRADMODEGGSRAD). Each of the four embodiments employ delta-doped layers which produce an internal free electron gas grid for shielding the anode. In the MODEGGSRAD, a quantum well layer is located between two of the doped layers to form better shielding capacity of the electron gas grid, is composed of an undoped material different than the material of the semiconductor, and the two-dimensional electron gas forms in the undoped quantum well and not in the delta-doped layer. The GRABEGGSRAD and the GRABMODEGGSRAD, each include a varied composition of the semiconductor material near the delta-doped layers to produce spatial variation of the conduction band energy. All of the four EGGSRAD structures or embodiments have in common: 1) an electron gas grid, 2) the same basic features (the delta-doped layers), and 3) the same mode of operation. The EEGGSRAD embodiment is the simplest. The MODEGGSRAD uses modulation doping to improve the grid shielding capacity, and the GRABEGGSRAD and the GRABMODEGGSRAD use graded bandgaps to further optimize the detector performance by enhancing control of the electron transmission through the grid. Since these four structures or embodiments operate in the same way, they are collectively termed EGGSRAD.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 3 is a cross-sectional view of an embodiment of an elementary electron gas grid semiconductor radiation detector (EEGGSRAD) made in a accordance with the present invention.

FIG. 4 is an energy-band diagram corresponding to the detector of FIG. 3.

FIG. 5 is a cross-sectional view of an embodiment of a modulation doped electron gas grid semiconductor radiation detector (MODEGGSRAD) made in accordance with the present invention.

FIG. 6 is an energy-band diagram corresponding to the detector of FIG. 5.

FIG. 7 is a cross-sectional view of an embodiment of a graded bandgap electron gas grid semiconductor radiation detector (GRABEGGSRAD) made in accordance with the present invention, and which is a modification of the FIG. 3 detector.

FIG. 8 is a cross-sectional view of an embodiment of a graded bandgap modulation doped electron gas grid semiconductor radiation detector (GRABMODEGGSRAD) made in accordance with the present invention, and which is a modification of the FIG. 5 detector.

DETAILED DESCRIPTION OF THE INVENTION

The present invention is directed to an improved semiconductor radiation detector useful for gamma-ray and x-ray spectrometers and imaging systems. The electron gas grid semiconductor radiation detector (EGGSRAD) of the present invention employs doping of the semiconductor and variation of the semiconductor detector materials to form a two-dimensional electron gas and to allow transistor action within the radiation detector. The EGGSRAD has in its structure delta-doped layers, which are atomically thin planar layers of material that function as atomically thin charged sheets. These doped thin layers can be deposited during the growth of the detector, such as by molecular beam epitaxy or chemical vapor deposition. By the Poisson equation, each of these charged delta-doped layers change the electric field at the layer. Four embodiments of the EGGSRAD are illustrated and described, but each embodiment includes the delta-doped layers and all operate in the same way. The simplest embodiment uses the delta-doped layers with a grid connected to the center layer. Another embodiment utilizes modulation doping with a quantum well layer placed between two of the delta-doped layers and the grid is connected to the quantum well. The third and fourth embodiments are similar to the first and second embodiments but utilize a graded bandgap adjacent to the outer two delta-doped layers. Also, the fourth embodiment may utilize a graded quantum well.

Figure 1:
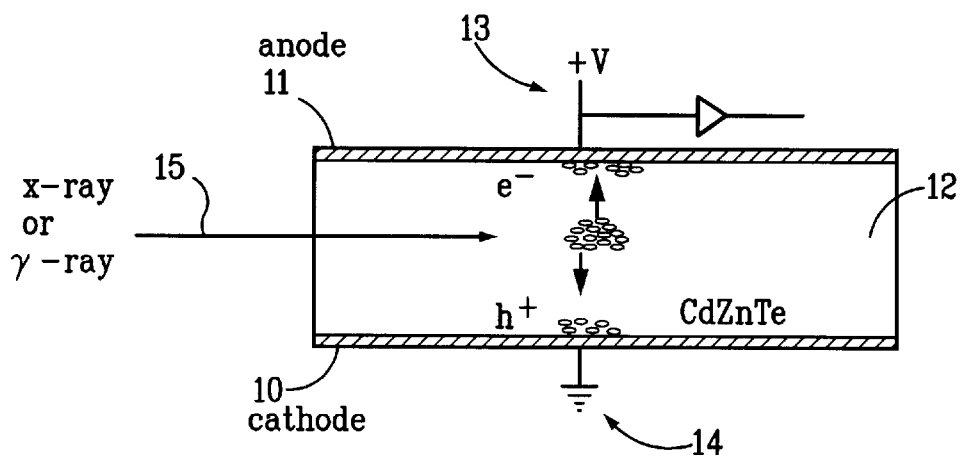
FIG. 1 is a cross-sectional view of a prior art planar semiconductor radiation detector.

Referring now to the drawings, FIG. 1 illustrates a conventional planar semiconductor radiation detector which, as set forth above, operates by absorbing a quantum of x-ray or gamma-ray radiation and by converting its energy into a number of electron-hole pairs that is proportional to the absorbed energy. After the conversion, the motion of the electrons and holes induce electrical signals on the detector electrodes. In the absence of electron and hole trapping, the electrical signals are also proportional to the energy of the absorbed radiation.

As shown in FIG. 1 the conventional planar semiconductor radiation detector comprises a cathode 10, an anode 11 and between which is a quantity of semiconductor material 12, such as CdZnTe, a positive voltage, indicated at 13, is applied to the anode and a negative voltage indicated at 14 is applied to the cathode. As x-rays or gamma-rays indicated by the legend and arrow 15 pass through the material 12 electrons (e−) and holes (h+) are formed and electrical signals are generated, as described above, and the energy of x-ray or gamma-ray radiation can be detected and measured.

Figure 2:
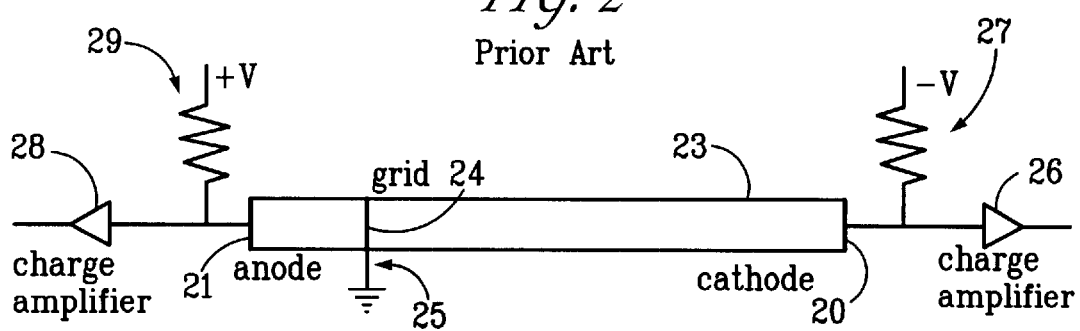
FIG. 2 schematically illustrates a prior art "electron-only" gamma-ray detector.

Since, as pointed out above, the conventional planar semiconductor radiation detector of FIG. 1 does not function well due to the poor transport properties of holes. Thus, "electron-only" detectors which utilize a grid located adjacent to the anode were developed, as discussed above, and FIG. 2 illustrates an embodiment of these prior art "electron-only" detectors. As shown in FIG. 2, which is a unipolar gamma-ray detector, the device comprises a cathode 20, an anode 21, a semiconductor material 23, and a grid 24 formed on the material 23, and in this device connected to ground as indicated at 25. The cathode 20 is connected to a charge amplifier 26 and to a negative (dc bias) voltage indicated at 27, with the anode 21 connected to a charge amplifier 28 and to a positive (dc bias) voltage indicated at 29. Here the holes at the grid 24 move toward the cathode 20 and the electrons at the grid move toward the anode 21, and thus "electrons-only" are directed to the anode, thus overcoming the above-mentioned problem relative to the poor electrical transport properties of holes.

While the "electron-only" detectors have given superior energy resolution for x-ray and gamma-ray radiation, there are imperfections associated therewith, as pointed out above. The electron gas grid semiconductor radiation detector (EGGSRAD) of the present invention overcomes the problems associated with the prior art "electron-only" devices, resulting in superior energy resolution and radiation detection efficiency. In addition, the EGGSRAD has all the virtues of the "electron-only" devices, exploiting the excellent transport properties of electrons over holes and having position independent signals.

Four structures of the gas grid semiconductor radiation detectors (EGGSRADS) are illustrated in FIGS. 3, 5, 7, and 8, with the detectors of FIGS. 7 and 8 being modifications of the detectors of FIGS. 3 and 5. The first of the four structures as illustrated in FIG. 3 is the most elementary and is thus referred to as an elementary electron gas grid semiconductor radiation detector (EEGGSRAD). As shown in FIG. 3, the detector comprises a cathode 30, and anode 31, a quantity of semiconductor material 32 such as CdZnTe and GaAs, in which is deposited delta-doped layers D1, D2, and D3, which layers are atomically thin planar layers of material that function as atomically thin charged, conductive sheets. For example, in a GaAs EEGGSRAD the delta-doped layers D1, D2, and D3 may be composed of Be, or Si, with a thickness of a few monolayers. A grid 33 is connected to layer D2 and is at zero voltage, as indicated at 34. The cathode 30 is connected to a negative bias voltage $(-V_c)$ as indicated at 35, and the anode 31 is connected to a positive bias voltage $(+V_A)$ as indicated at 36, and to a charge amplifier 37. In the FIG. 3 detector, a detection volume indicated at 38 between the cathode 30 and the layer D1 is relatively large compared to the measurement volume indicated at 39 between the anode 31 and the layer D3. By using atoms that become positively charged (see the conduction band 32') in the semiconductor material 32, layer D1 creates a sudden downward bending of the electrostatic potential, as seen in the energy band diagram of FIG. 4. The delta-doped layer D2 is placed to reverse the downward bending, thereby creating a potential well 40. The bottom of the potential well 40 fills with electrons in cases where the depth of the well is deeper than the quasi-Fermi level, indicated at 41. These electrons form a two-dimensional electron gas, which behaves like a very thin metal sheet on the order of 1–10 nm thick. By attaching an external metal electrode (grid 33) to the layer D2 on the surface of the semiconductor material of the detector, one can bias the two-dimensional electron gas and use it as an electron gas grid region, indicated at 42. Delta-doped layer D3 is placed to stop the upward bending of the potential, and to limit the grid region, as seen in FIG. 4. If properly designed, an electron incident, indicated by arrow 43, on it will have a large probability of traveling across the potential well 40, and the potential well will contain the two-dimensional electron gas. For these two criteria to be met, the EEGGSRAD of FIG. 3, as well as the embodiments of FIGS. 5, 7, & 8, must have the following basic features:

1. The delta-doped layers D1, D2, and D3 must be large enough in charge densities to cause the potential well 40 to contain the free electron gas.

2. The electric field between the delta-doped layers D1, D2, and D3 should not exceed the breakdown voltage of the semiconductor 32.

3. The charge density of the layer D1 must be larger than layer D2 so that the energy of the electrons launched into the grid region 42 from the cathode 30 side is larger than the minimum energy required to collect an electron at the end of the grid region 42 on the anode 31 side.

4. The entire width of potential well 40 of the grid region, i.e., the distance between D1 and D3 must be short enough that a significant fraction of the electrons make it across the potential well 40 of the grid region, despite the expected energy losses which occur as the electrons traverse the potential well of the grid region.

5. The potential well should not be too abrupt to minimize the quantum mechanical reflection of electrons at the interfaces.

In addition to the five (5) items above, for the detector to operate properly, the cathode needs to be biased sufficiently negative and the anode needs to be biased sufficiently positive, so that a unidirectional electrostatic field is maintained everywhere outside the grid region. When all five above items and the proper bias voltage is applied, the EEGGSRAD of FIG. 3 will function as a nearly ideal "electron-only" detector.

FIGS. 5 and 6 illustrate a second of the above-mentioned four (4) EGGSRAD structures. This second structure is a modulated doped EGGSRAD (MODEGGSRAD), wherein a quantum well (QW) is placed between the delta-doped layers D1 and D2, or between D2 and D3. The structure of the detector of FIG. 5 and the energy band diagram of FIG. 6, are generally similar to FIGS. 3 and 4, and corresponding components will be given corresponding reference numerals. The difference between the detectors of FIGS. 3 and 5, is the addition of a layer 44 forming quantum well which is located between layers D1 and D2, and with the grid 33' connected to the quantum well 44. If the quantum well 44 was located between layers D2 and D3, the operation would be the same. The layer 44 forming the quantum well can be made of a semiconductor material slightly different from the bulk semiconductor 32. For example, the layer 44 can be of CdTe to form a quantum well in a semiconductor 32 of CdZnTe, or a layer of InGaAs can form a quantum well in a semiconductor of GaAs. Note the similarities of the energy band diagrams of FIGS. 4 and 6. For both the EEGGSRAD (FIG. 3) and the MODEGGSRAD (FIG. 5), a two-dimensional electron gas forms and functions as an electron gas grid and both detectors operate in the same manner.

However, the two-dimensional electron gas in the MODEGGSRAD (FIG. 5) is in the undoped quantum well 44 and not at the delta-doped layer D2, as in FIG. 3. Because there are no impurities in the quantum well layer 44, the electrons move much faster, resulting in better shielding capacity of the electron gas grid 42' and faster time response of the grid. This method of forming the high mobility and high conductivity two-dimensional electron gas using a combination of the undoped quantum well and a doped layer is commonly called modulation doping. In the EEGGSRAD of FIGS. 3 & 4, the two-dimensional gas can undergo scattering from the delta-doping atoms of layer D2, possibly degrading the conductivity of the layer and its shielding capacity. The primary advantages of the MODEGGSRAD of FIGS. 5 and 6 are realized when the detector is operated at lower temperatures.

In addition, by comparing the energy band diagrams of FIGS. 4 and 6, note that the electric fields (equal to the slope of the conduction band) between D1 and D2 and also between D2 and D3 are significantly smaller for the MODEGGSRAD than for the EEGGSRAD. In the MODEGGSRAD, the quantum well 44 gives extra depth. This means that, in the MODEGGSRAD, the charge concentration at D1, D2, and D3 are reduced significantly. Since the size of the potential well of the grid region is largely determined by the constraint that the electric field in the region does not exceed the breakdown voltage in the semiconductor 32, in the MODEGGSRAD one can reduce the size of the grid region. This is important for maximizing the likelihood of electrons traversing this region.

The last two structures of the EGGSRAD, shown in FIGS. 7 and 8, are referred to as a graded bandgap EGGSRAD (GRABEGGSRAD) and a graded bandgap MODEGGSRAD (GRABMODEGGSRAD), and constitute modifications of the detectors of FIGS. 3 and 5, respectively. In the structures of FIGS. 7 and 8, the composition of the semiconductor 32 is varied near the grid regions (delta-doped layers D1, D2, and D3) to produce a spatial variation of the conduction band energy. This must be done near the grid (33 or 33') and it must be thin relative to the overall thickness of the detector, because an energy bandgap variation in the detection volume 38 of the detector causes a spatial variation in the number of electron-hole pairs created. This number is proportional to the energy bandgap of the semiconductor. As shown in FIGS. 7 and 8, the graded or varied bandgap is illustrated by the areas 45 and 46 of the semiconductor 32 adjacent delta-doped layers D1 and D3, with other components of FIGS. 7 and 8 being given the same reference numeral as in FIGS. 3 and 5, respectively.

For example, in a semiconductor 32 of CdZnTe, the Zn composition of the area 45 near layer D1 can be increased (for example, from 10% to 15%) to make the conduction band energy higher there. This increases the energy of electrons launched into the grid region, just as increasing the charge concentration at layer D1 does. Hence, by using a graded bandgap 45, one can reduce the charge concentration of layer D1 in both the GRABEGGSRAD (FIG. 7) and the GRABMODEGGSRAD (FIG. 8). Near layer D3, the Zn composition of area 46 can be decreased (for example, from 10% to 5% to make the energy lower there, allowing the decrease of the charge concentration at layer D3. This will decrease the quantum mechanical reflection at this interface.

In addition, in the GRABMODEGGSRAD (FIG. 8), the rectangular quantum well 44 can be replaced by a graded quantum well. For example, one can grow the quantum well so that the Zn variation in a CdZnTe crystal has a smaller gradient and therefore, there would exist no abrupt change in Zn alloy composition. Using a graded quantum well, one reduces quantum mechanical reflection from the walls of the quantum well.

The EGGSRAD of the present invention exploits the semiconductor crystal technology to create an internal grid. In addition, the delta doped layers (in the EEGGSRAD of FIG. 3), the modulated doped layers (in the MODEGGSRAD of FIG. 5), and the graded energy bandgap layers (the GRABEGGSRAD of FIG. 7 and the GRADMO-DEGGSRAD of FIG. 8) are used to create an electron gas grid, which is extremely thin (~1 nm to 10 nm) but highly conducting and allows high probability for transmission of electrons through the grid. Also, in designing an EGGSRAD (FIGS. 3, 5, 7, and 8), knowledge of the semiconductor energy band structure and electrical transport properties is used to maximize the transistor action across the grid. More specifically, the energy loss across the base region is minimized by making it narrow, the quantum mechanical reflection is reduced by making the potential less abrupt, and the electron injection energy into the grid region is made significantly larger than the expected energy loss across it.

In performance, the EGGSRAD of the present invention has the potential of being better than any existing detector. Because the EGGSRAD of the present invention is an "electron-only" detector, it is clearly superior to the conventional planar radiation detector having only two electrodes, in terms of both energy resolution and detection volume efficiency. In addition, the imperfections associated with the prior art "electron-only" devices are eliminated in the following way:

(1) The grid can be placed very close the anode, without decreasing its shielding capacity. This increases the detection volume of the device and hence the detection efficiency of the device.

(2) There is no dead or degraded region of the detector, since all electrons incident on the grid have approximately unity probability of crossing it.

(3) The internal electric field of the device outside the grid region is perfectly uniform because the grid is parallel to the cathode and the anode. This means that, in any given plane within the detector parallel to the grid, the signal resulting from a x-ray or gamma-ray will be identical, even in the presence of electron trapping. If the detector is oriented so that it operates with x-rays or gamma-rays incident perpendicular to the cathode or anode, then one fully exploits the uniformity of the internal electric field and the best energy resolution can be expected. In addition, the commonly used scheme to correct the electron signal from the anode using the signal from the cathode should work much better due to the uniformity of the electric field.

Hence, a clearly better performance is obtained from the EGGSRAD, in comparison to the prior art "electron-only" devices.

The EGGSRAD of the present invention can be made from any high resistivity semiconductor material. In addition to CdZnTe and GaAs, exemplified above, InP and Si semiconductor material may be utilized.

The EGGSRAD can be utilized in x-ray and gamma-ray spectrometers for medical imaging, environmental monitoring, baggage handling, and materials sorting applications. Further the EGGSRAD can be utilized in various government applications such as to detect nuclear smuggling, safeguard dismantled nuclear materials, search for nuclear weapons, verify treaty compliance, locate unexploded ordnance, detect contraband drugs, perform forensic analysis, conduct x-ray astronomy, cleanup waste sites, and act as personal dosimeters.

It has thus been shown, that the present invention provides an improved planar semiconductor radiation detector comprising an electron gas grid semiconductor radiation detector (EGGSRAD), with the basic use of delta-doped layers in the semiconductor material. Four (4) detector structures have been illustrated and described, and each of these EGGSRAD structures have in common: 1) an electron gas grid, 2) the same basic features, and 3) the same mode of operation. The EEGGSRAD embodiment (FIG. 3) being the simplest. The MODEGGSRAD embodiment (FIG. 5) uses modulation doping to improve the grid shielding capacity, and the GRABEGGSRAD and the GRABMODEGGSRAD embodiments (FIGS. 7 and 8) use graded bandgaps to further optimize the detector performance by enhancing control of the electron transmission through the grid.

While particular embodiments have been illustrated and described, along with particular materials and parameters to exemplify and teach the principles of the invention, such are not intended to be limiting. Modifications and changes may become apparent to those skilled in the art, and it is intended that the invention be limited only by the scope of the appended claims.

What is claimed is:

1. A semiconductor radiation detector having a two-dimensional electron gas grid, comprising:

a first semiconductor material having at least first and second surfaces, wherein said first and second surfaces are each adapted to include an attached electrode, wherein one of said attached electrodes is biased with a negative voltage and designated as the cathode, and wherein the remaining electrode is biased with a positive voltage and is designated as the anode;

at least three spaced delta-doped layers disposed in said first semiconductor material wherein each of said delta-doped layers extends over a cross-section of said first semiconductor material and wherein each of said delta-doped layers is further disposed about proximate to said anode; and a grid electrode attached to an intermediate one of said at least three delta-doped layers, said grid electrode biased at zero volts such that a potential well is established in a region proximate said intermediate delta-doped layer, said at least three delta-doped layers operating together such that said potential well extends below a quasi-Fermi level such that a plurality of electrons are trapped by said potential well thereby creating said two-dimensional electron gas grid.

2. The semiconductor radiation detector of claim 1, wherein said first semiconductor material is selected from the group consisting of CdZnTe, CdTe, GaAs, InP, and Si.

3. The semiconductor radiation detector of claim 2, wherein said first semiconductor material is GaAs and wherein said at least three delta-doped layers are composed of Be and Si, said layers having a thickness of about 1 nm to 10 nm.

4. The semiconductor radiation detector of claim 1, wherein an electric field between said at least three delta-doped layers is less than a breakdown voltage of said first semiconductor material.

5. The radiation semiconductor detector of claim 1, wherein a potential well formed by said at least three delta-doped layers is constructed so as to minimize a quantum mechanical reflection of electrons.

6. The semiconductor radiation detector of claim 1, wherein said cathode and anode bias provides and maintains a unidirectional electrostatic field outside of a grid region formed in a region of said at least three delta-doped layers.

7. The semiconductor radiation detector of claim 1, additionally including a second semiconducting material having a different composition and having a smaller energy bandgap than said first semiconductor material, wherein said second semiconducting material is disposed in a layer between two of said at least three delta-doped layers.

8. The semiconductor radiation detector of claim 7, wherein said grid electrode is connected to said layer of said second semiconducting material.

9. The semiconductor radiation detector of claim 7, wherein said first semiconductor material is composed of either CdZnTe or GaAs, and wherein said second semiconductor material is composed of either CdTe or InGaAs.

10. The semiconductor radiation detector of claim 1, wherein said first semiconductor material consists essentially of CdZnTe, and wherein said radiation detector further comprises first and second regions disposed to either side of and contiguous with said at least three delta-doped layers, said first region further disposed between said anode and said at least three delta-doped layers and having with a zinc composition about 10% to 15% greater than said first semiconductor material, said second region further disposed between said cathode and said at least three delta-doped layers and having with a zinc composition about 5% to 10% less than said first semiconductor material.

* * * * *